(12) United States Patent
Cappellani et al.

(10) Patent No.: US 10,026,829 B2
(45) Date of Patent: *Jul. 17, 2018

(54) SEMICONDUCTOR DEVICE WITH ISOLATED BODY PORTION

(71) Applicant: Intel Corporation, Santa Clara, CA (US)

(72) Inventors: Annalisa Cappellani, Portland, OR (US); Stephen M. Cea, Hillsboro, OR (US); Tahir Ghani, Portland, OR (US); Harry Gomez, Hillsboro, OR (US); Jack T. Kavalieros, Portland, OR (US); Patrick H. Keys, Portland, OR (US); Seiyon Kim, Portland, OR (US); Kelin J. Kuhn, Aloha, OR (US); Aaron D. Lilak, Beaverton, OR (US); Rafael Rios, Portland, OR (US); Mayank Sahni, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/434,981

(22) Filed: Feb. 16, 2017

(65) Prior Publication Data
US 2017/0162676 A1 Jun. 8, 2017

Related U.S. Application Data

(63) Continuation of application No. 13/995,418, filed as application No. PCT/US2011/066171 on Dec. 20, 2011, now Pat. No. 9,608,059.

(51) Int. Cl.
H01L 29/66 (2006.01)
H01L 29/78 (2006.01)
(Continued)

(52) U.S. Cl.
CPC ........ *H01L 29/66818* (2013.01); *B82Y 10/00* (2013.01); *H01L 21/762* (2013.01);
(Continued)

(58) Field of Classification Search
CPC ............ H01L 29/66818; H01L 21/762; H01L 21/76216; H01L 27/1203; H01L 29/0649;
(Continued)

(56) References Cited

U.S. PATENT DOCUMENTS 8,039,843 B2 10/2011 Inaba
8,237,226 B2 8/2012 Okano
(Continued)

FOREIGN PATENT DOCUMENTS

CN 1855390 11/2006
CN 101097956 1/2008
(Continued)

OTHER PUBLICATIONS

Notice of Preliminary Rejection from Korean Patent Application No. 10-2016-7024516 dated Jan. 18, 2017, 5 pgs.
(Continued)

*Primary Examiner* — Fernando L Toledo
*Assistant Examiner* — Neil Prasad
(74) *Attorney, Agent, or Firm* — Schwabe, Williamson & Wyatt, P.C.

(57) ABSTRACT

Semiconductor devices with isolated body portions are described. For example, a semiconductor structure includes a semiconductor body disposed above a semiconductor substrate. The semiconductor body includes a channel region and a pair of source and drain regions on either side of the channel region. An isolation pedestal is disposed between the semiconductor body and the semiconductor
(Continued)

substrate. A gate electrode stack at least partially surrounds a portion of the channel region of the semiconductor body.

25 Claims, 12 Drawing Sheets

(51) Int. Cl.
   *H01L 21/762* (2006.01)
   *H01L 29/06* (2006.01)
   *H01L 29/775* (2006.01)
   *H01L 27/12* (2006.01)
   *B82Y 10/00* (2011.01)
   *H01L 29/423* (2006.01)

(52) U.S. Cl.
   CPC .... *H01L 21/76216* (2013.01); *H01L 27/1203* (2013.01); *H01L 29/0649* (2013.01); *H01L 29/0653* (2013.01); *H01L 29/0673* (2013.01); *H01L 29/42392* (2013.01); *H01L 29/66795* (2013.01); *H01L 29/775* (2013.01); *H01L 29/785* (2013.01)

(58) Field of Classification Search
   CPC ............. H01L 29/0653; H01L 29/0673; H01L 29/42392; H01L 29/66795; H01L 29/775; H01L 29/785; B82Y 10/00
   See application file for complete search history.

(56) References Cited

U.S. PATENT DOCUMENTS

| | | | |
|---|---|---|---|
| 8,324,940 | B2 | 12/2012 | Bangsaruntip et al. |
| 8,520,430 | B2 | 8/2013 | Bangsaruntip et al. |
| 9,608,059 | B2 * | 3/2017 | Cappellani ........ H01L 29/66795 |
| 2006/0292772 | A1 | 12/2006 | Anderson et al. |
| 2007/0148857 | A1 | 6/2007 | Ban et al. |
| 2008/0111184 | A1 | 5/2008 | Beintner et al. |
| 2008/0142891 | A1 | 6/2008 | Booth et al. |
| 2009/0008705 | A1 | 1/2009 | Zhu et al. |
| 2009/0278196 | A1 | 11/2009 | Chang et al. |
| 2010/0163971 | A1 | 7/2010 | Hung et al. |

FOREIGN PATENT DOCUMENTS

| | | |
|---|---|---|
| CN | 101577278 | 11/2009 |
| CN | 102034714 | 4/2011 |
| DE | 10142307 | 3/2003 |
| JP | 2009259865 | 11/2009 |
| KR | 10-2009-0007393 | 1/2009 |
| TW | 200913078 | 3/2009 |
| WO | WO-2011013271 | 2/2011 |
| WO | WO-2011072520 | 6/2011 |

OTHER PUBLICATIONS

First Chinese Office Action from Chinese Patent Application No. 201180076400.5, dated Apr. 19, 2016, 15 pgs.
Notice of Second Preliminary Rejection from Korean Patent Application No. 10-2014-7017845, dated Jan. 13, 2016, 5 pgs.
Notice of Preliminary Rejection from Korean Patent Application No. 10-2014-7017845, dated Jul. 28, 2015, 5 pgs.
Office Action for Taiwanese Patent Application No. 101142630, dated Jan. 28, 2015, 3 pgs.
Non-Final Office Action from U.S. Appl. No. 13/995,418 dated Aug. 14, 2014, 12 pgs.
Office Action and Search Report for Taiwan Patent Application No. 101142630, dated Aug. 21, 2014, 9 pgs.
International Search Report and Written Opinion for PCT Patent Application No. PCT/US2011/066171 dated Aug. 31, 2012, 10 pgs.
International Preliminary Report on Patentability from PCT/US2011/066171 dated Jul. 3, 2014, 7 pgs.
Final Office Action from U.S. Appl. No. 13/995,418 dated Dec. 4, 2014, 19 pgs.
Non-Final Office Action from U.S. Appl. No. 13/995,418 dated Dec. 4, 2015, 13 pgs.
Final Office Action from U.S. Appl. No. 13/995,418 dated Jun. 30, 2016, 13 pgs.
Second Office Action from Chinese Patent Application No. 201180076400.5 dated Oct. 25, 2016, 14 pgs.
Office Action for Chinese Patent Application No. 201180076400.5, dated Apr. 25, 2017, 6 pgs.
Non-Final Office Action for Korean Patent Application No. 1020177007510, dated Apr. 18, 2017, 6 pgs.
Office Action for Korean Patent Application No. 10-2016-7024516 dated Dec. 27, 2017, 4 pgs., with English translation.
Notice of Allowance for Korean Patent Application No. 10-2016-7024516 dated Feb. 7, 2018, 3 pgs., no translation.

* cited by examiner

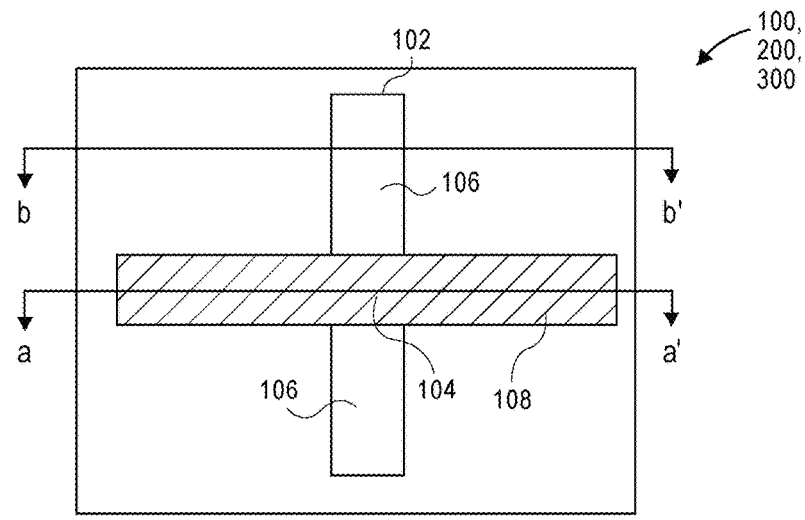
FIG. 1A
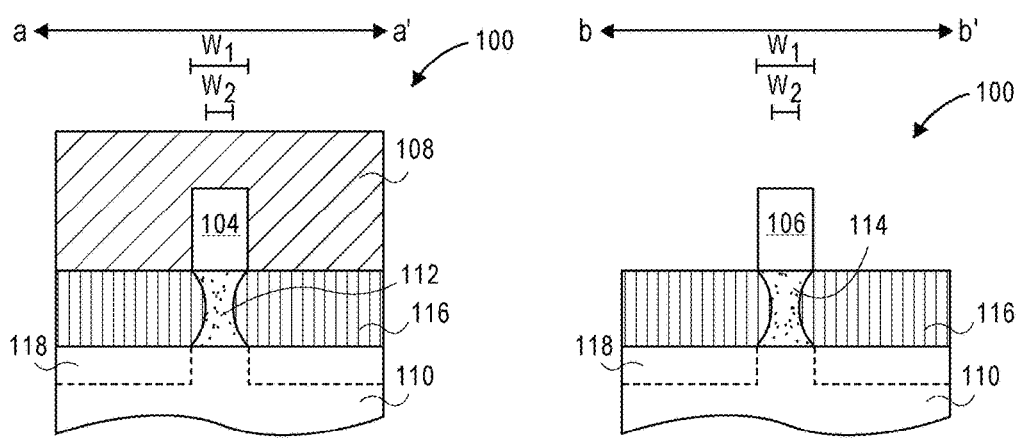
FIG. 1B  FIG. 1C

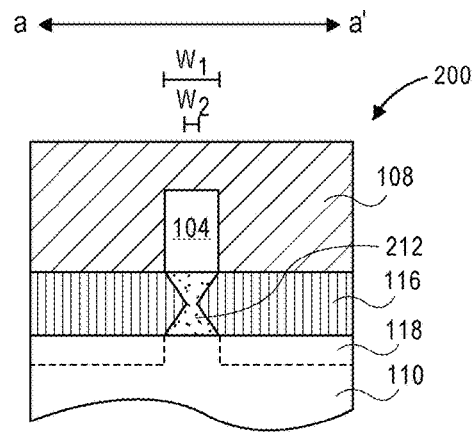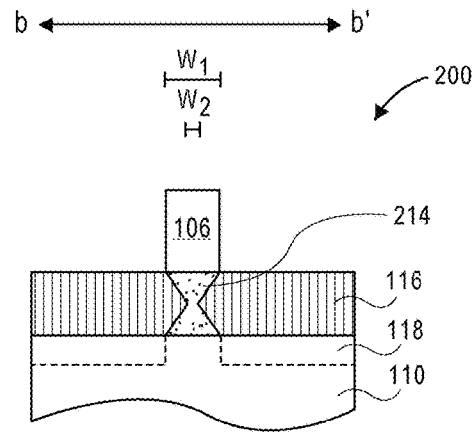
FIG. 2A     FIG. 2B
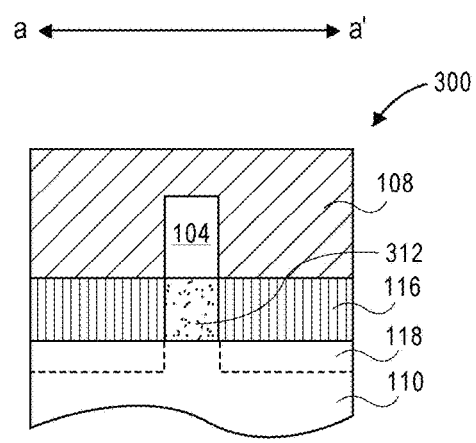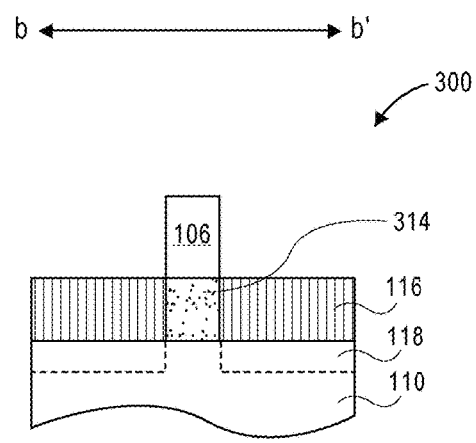
FIG. 3A     FIG. 3B

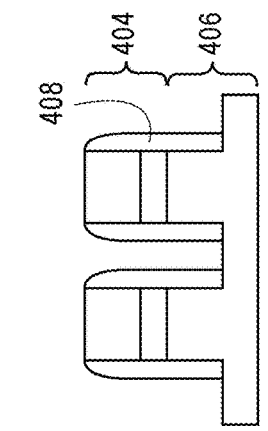
FIG. 4A
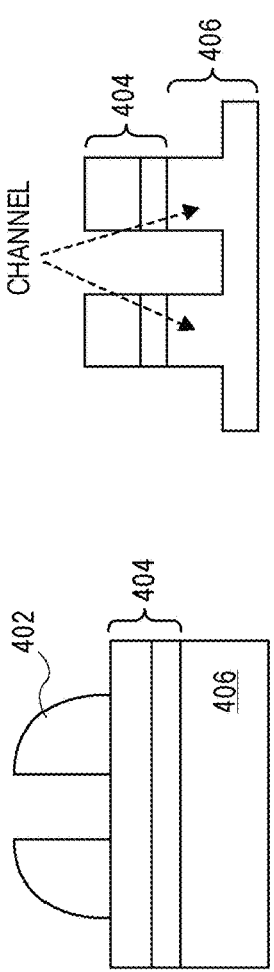
FIG. 4B
FIG. 4C
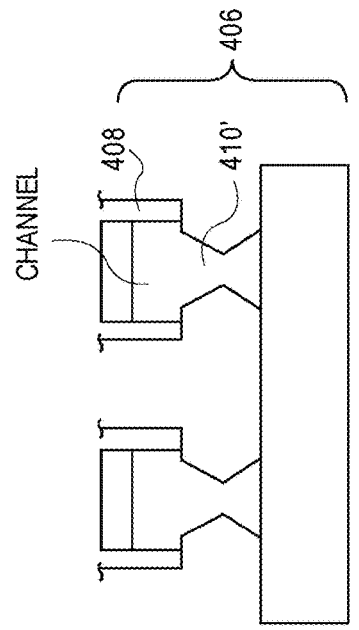
FIG. 4D
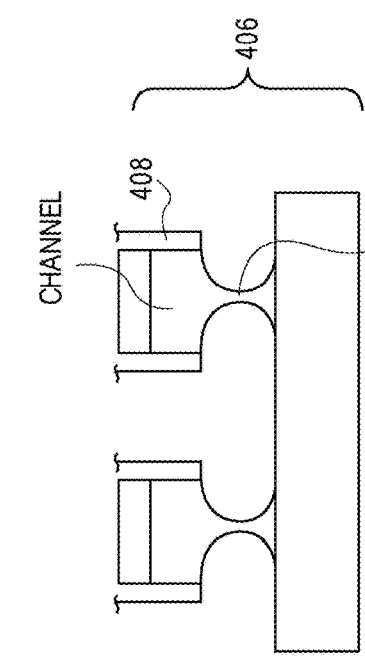
FIG. 4D'

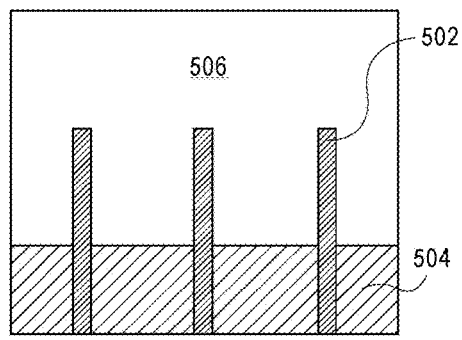
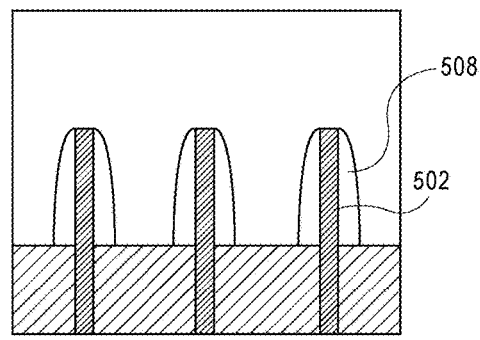
FIG. 5A            FIG. 5B
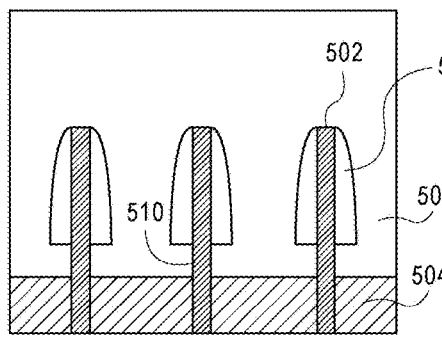
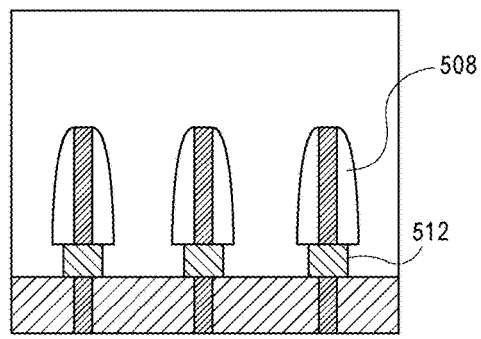
FIG. 5C            FIG. 5D
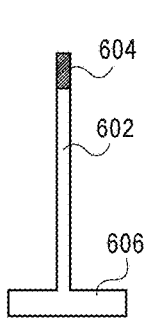 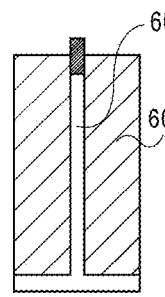 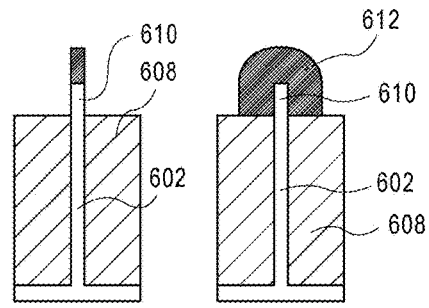
FIG. 6A  FIG. 6B  FIG. 6C  FIG. 6D

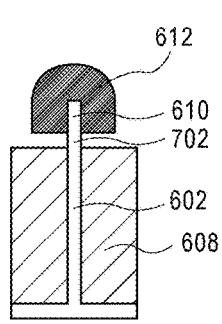 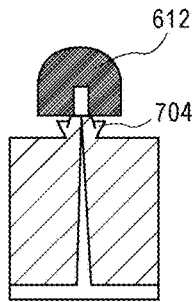 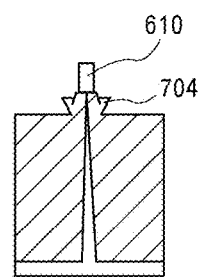
FIG. 7A	FIG. 7B	FIG. 7C
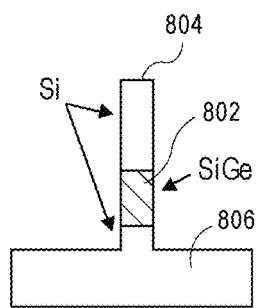 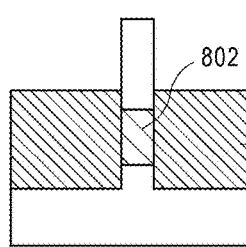 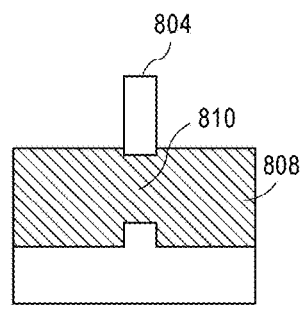
FIG. 8A	FIG. 8B	FIG. 8C
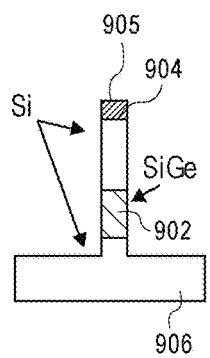 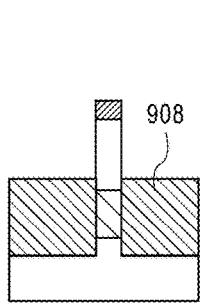 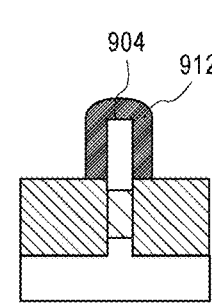 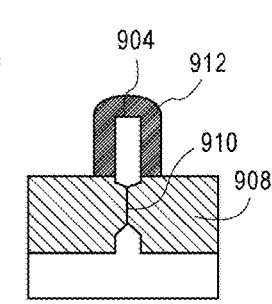
FIG. 9A  FIG. 9B  FIG. 9C  FIG. 9D

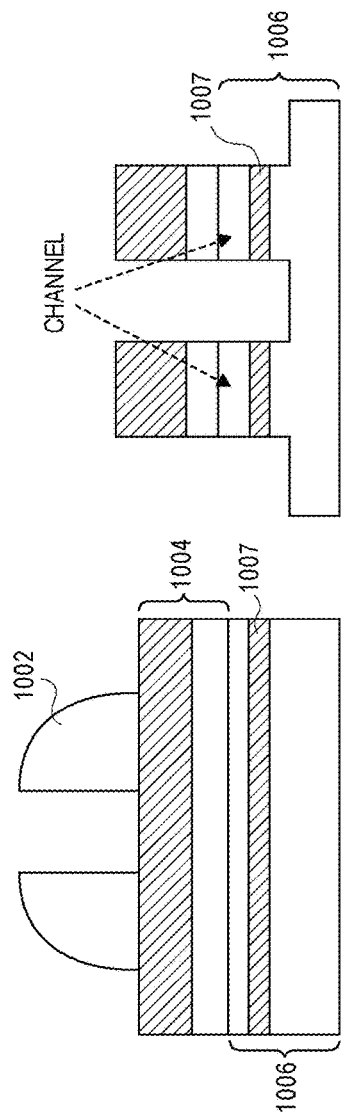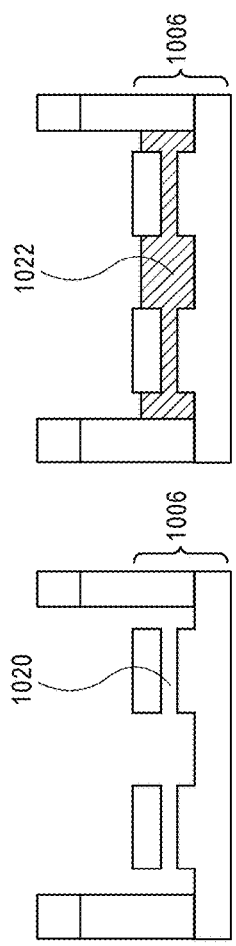
FIG. 10A
FIG. 10B
FIG. 10C
FIG. 10D

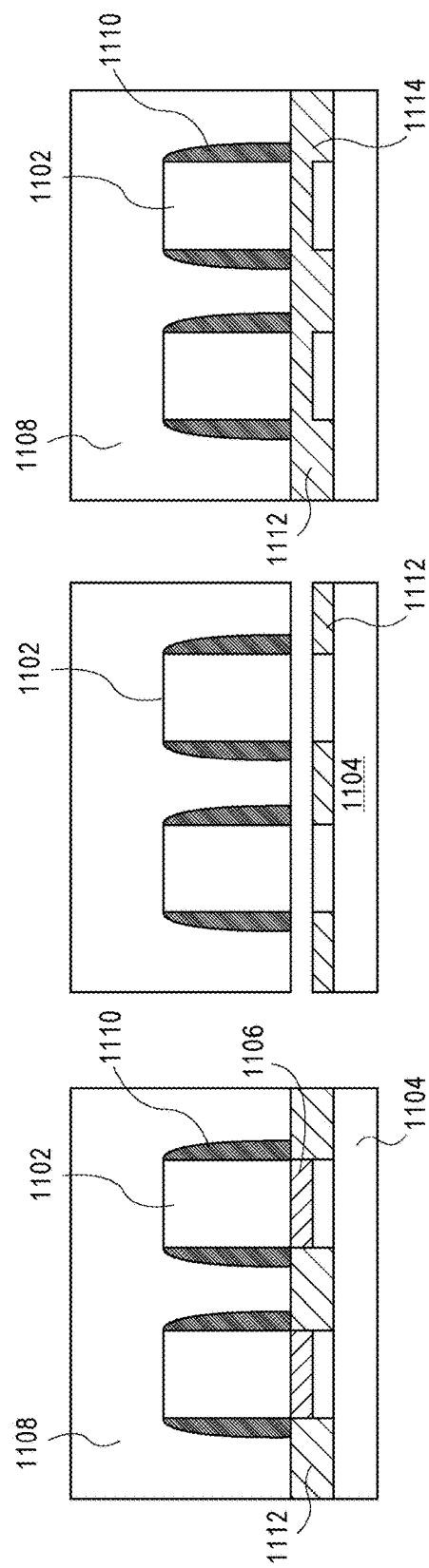

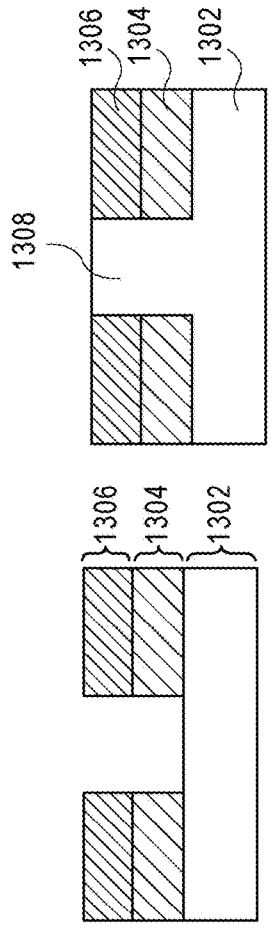
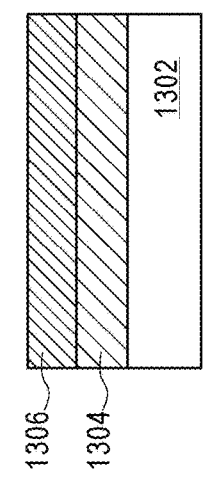
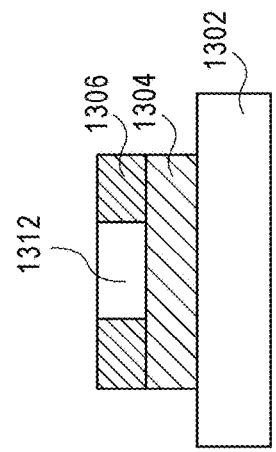
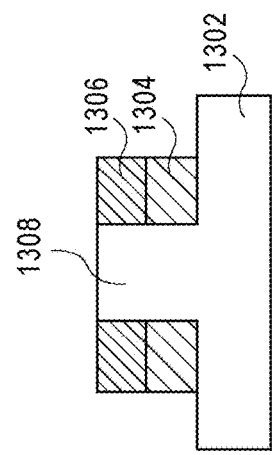
FIG. 13A  FIG. 13B  FIG. 13C  FIG. 13D  FIG. 13E

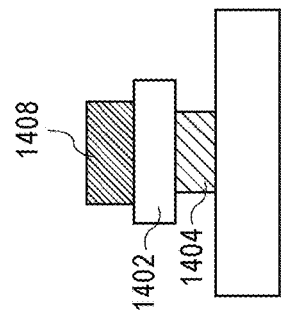
FIG. 14A
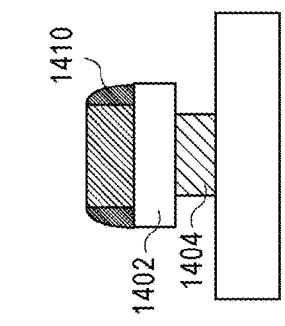
FIG. 14B
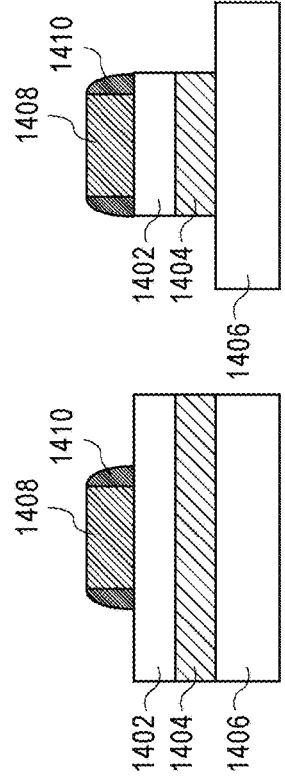
FIG. 14C
FIG. 14D
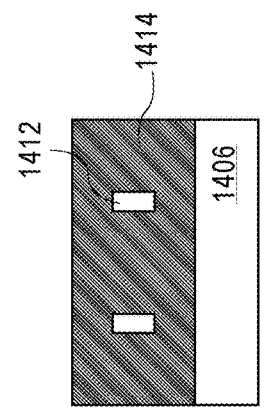
FIG. 14E
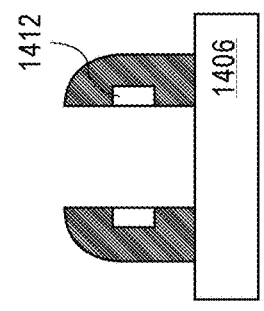
FIG. 14F
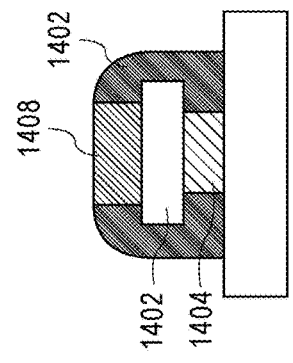
FIG. 14G
FIG. 14H

SEMICONDUCTOR DEVICE WITH ISOLATED BODY PORTION

CROSS-REFERENCE TO RELATED APPLICATIONS

This application is a continuation of U.S. patent application Ser. No. 13/995,418, filed on Jun. 18, 2013, which is a U.S. National Phase application under 35 U.S.C. § 371 of International Application No. PCT/US2011/066171, filed Dec. 20, 2011, entitled "SEMICONDUCTOR DEVICE WITH ISOLATED BODY PORTION," the entire contents of which are hereby incorporated by reference herein.

TECHNICAL FIELD

Embodiments of the invention are in the field of semiconductor devices and, in particular, semiconductor devices with isolated body portions.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

On bulk silicon substrates, the fabrication process for tri-gate transistors often encounters problems when aligning the bottom of the metal gate electrode with the source and drain extension tips at the bottom of the transistor body (i.e., the "fin"). When the tri-gate transistor is formed on a bulk substrate, proper alignment is needed for optimal gate control and to reduce short-channel effects. For instance, if the source and drain extension tips are deeper than the metal gate electrode, punch-through may occur. Alternately, if the metal gate electrode is deeper than the source and drain extension tips, the result may be an unwanted gate cap parasitic.

Accordingly, there is a need for a tri-gate transistor fabrication process that combines the ease of fabrication provided by bulk substrates with the improved short channel effects provided by silicon-on-insulator substrates.

SUMMARY

Embodiments of the present invention include semiconductor devices with isolated body portions.

In an embodiment, a semiconductor structure includes a semiconductor body disposed above a semiconductor substrate. The semiconductor body has a first width and includes a channel region and a pair of source and drain regions on either side of the channel region. An isolation pedestal is disposed between the semiconductor body and the semiconductor substrate. The isolation pedestal has a second width parallel with and less than the first width. A gate electrode stack at least partially surrounds a portion of the channel region of the semiconductor body.

In another embodiment, a semiconductor structure includes a semiconductor body disposed above a semiconductor substrate. The semiconductor body is composed of a first semiconductor material and includes a channel region and a pair of source and drain regions on either side of the channel region. An isolation pedestal is disposed between the semiconductor body and the semiconductor substrate. The isolation pedestal is composed of an oxide of a second semiconductor material different from the first semiconductor material. A gate electrode stack at least partially surrounds a portion of the channel region of the semiconductor body.

In another embodiment, a method of fabricating a semiconductor device includes forming a semiconductor body above a semiconductor substrate. The semiconductor body includes a channel region and a pair of source and drain regions on either side of the channel region. An isolation pedestal is formed between the semiconductor body and the semiconductor substrate. Either the semiconductor body has a first width and the isolation pedestal is formed from a second width parallel with and less than the first width, or the semiconductor body is composed of a first semiconductor material and the isolation pedestal is composed of an oxide of a second semiconductor material different from the first semiconductor material, or both. A gate electrode stack is formed at least partially surrounding a portion of the channel region of the semiconductor body.

In another embodiment, a method of fabricating a semiconductor device includes forming a semiconductor body on a semiconductor substrate. The semiconductor body includes a channel region and a pair of source and drain regions on either side of the channel region. The method also includes implanting oxygen atoms into the semiconductor substrate, on either side of at least a portion of the semiconductor body. The semiconductor substrate is then annealed to form, by oxidation from the implanted oxygen atoms, an isolation pedestal between the portion of the semiconductor body and the semiconductor substrate. A gate electrode stack is formed to at least partially surround a portion of the channel region of the semiconductor body.

BRIEF DESCRIPTION OF THE DRAWINGS

FIG. 1A illustrates a plan view of semiconductor devices 100, 200, or 300, in accordance with an embodiment of the present invention.

FIG. 1B illustrates a cross-sectional channel view of the semiconductor device 100 of FIG. 1A, as taken along the a-a' axis, in accordance with an embodiment of the present invention.

FIG. 1C illustrates a cross-sectional source/drain view of the semiconductor device 100 of FIG. 1A, as taken along the b-b' axis, in accordance with an embodiment of the present invention.

FIG. 2A illustrates a cross-sectional channel view of the semiconductor device 200 of FIG. 1A, as taken along the a-a' axis, in accordance with an embodiment of the present invention.

FIG. 2B illustrates a cross-sectional source/drain view of the semiconductor device 200 of FIG. 1A, as taken along the b-b' axis, in accordance with an embodiment of the present invention.

FIG. 3A illustrates a cross-sectional channel view of the semiconductor device 300 of FIG. 1A, as taken along the a-a' axis, in accordance with an embodiment of the present invention.

FIG. 3B illustrates a cross-sectional source/drain view of the semiconductor device 300 of FIG. 1A, as taken along the b-b' axis, in accordance with an embodiment of the present invention.

FIGS. 4A-4D and 4D' illustrate cross-sectional views representing various operations in a first method of fabricating a semiconductor device, in accordance with an embodiment of the present invention.

FIGS. 5A-5D illustrate cross-sectional views representing various operations in a second method of fabricating a semiconductor device, in accordance with an embodiment of the present invention.

FIGS. 6A-6D illustrate cross-sectional views representing various operations in a third method of fabricating a semiconductor device, in accordance with an embodiment of the present invention.

FIGS. 7A-7C illustrate cross-sectional views representing various operations in a fourth method of fabricating a semiconductor device, in accordance with an embodiment of the present invention.

FIGS. 8A-8C illustrate cross-sectional views representing various operations in a fifth method of fabricating a semiconductor device, in accordance with an embodiment of the present invention.

FIGS. 9A-9D illustrate cross-sectional views representing various operations in a sixth method of fabricating a semiconductor device, in accordance with an embodiment of the present invention.

FIGS. 10A-10D illustrate cross-sectional views representing various operations in a seventh method of fabricating a semiconductor device, in accordance with an embodiment of the present invention.

FIGS. 11A-11C illustrate cross-sectional views representing various operations in an eighth method of fabricating a semiconductor device, in accordance with an embodiment of the present invention.

FIGS. 13A-13E illustrate cross-sectional views representing various operations in a tenth method of fabricating a semiconductor device, in accordance with an embodiment of the present invention.

FIGS. 14A-14H illustrate cross-sectional views representing various operations in an eleventh method of fabricating a semiconductor device, in accordance with an embodiment of the present invention.

DETAILED DESCRIPTION

Figure 12A:
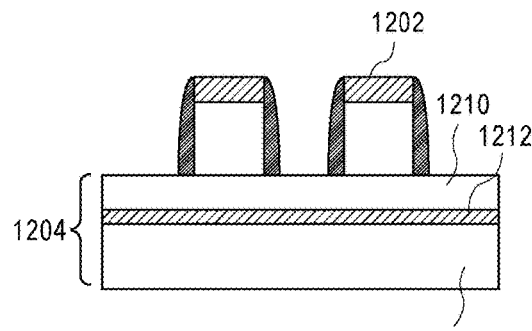
FIGS. 12A-12D illustrate cross-sectional views representing various operations in a ninth method of fabricating a semiconductor device, in accordance with an embodiment of the present invention.

Semiconductor devices with isolated body portions are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Methods to isolate channel or source and drain regions, or both, of a semiconductor body of a semiconductor device from an underlying semiconductor substrate are described, along with the resulting structures. In an embodiment, one or more isolation pedestals are formed between a semiconductor body and a semiconductor substrate. The isolation pedestal may be distinguished from other adjacent isolating material, even if composed of the same material. Approaches described herein may be referred to as under-fin oxidation (UFO) processes. Such processes may be used to suppress or entirely block leakage in a resulting semiconductor device.

In an embodiment, a transistor fabrication process involves the formation of an oxide layer that electrically isolates the subfin region of a FIN or of a wire, such as a nanowire. One or more embodiments of the present invention enable implementation of silicon-on-insulator (SOI) type fins or ribbons starting with bulk substrates, such as bulk silicon substrates. In one such embodiment, this is achieved by the formation of an oxide layer under the subFIN channel. One or more embodiments of the present invention enable independent facilitation of channel doping from substrate doping since initial fabrication is from a bulk substrate. However, in an embodiment, if the oxide isolation (UFO) is performed also or only under the source and drain areas, the facilitation may only be for bulk junction leakage suppression.

Under conventional processing of trigate or FIN-FET transistors from bulk silicon substrates, sub-FIN leakage of the resulting devices may occur. Such leakage may render difficult the targeting and controlling of $I_{off}$ (off-state source and drain leakage). The leakage may be effectively suppressed by the introduction of an insulating layer at the bottom of the FIN, in the area that has poor or no gate control. In an embodiment, the introduction of an insulating material also may enable an easy targeting of channel doping reduction to achieve a lightly doped or fully undoped channel device. Having a buried oxide in the sub-fin region may also relax the conflicting constraints and simultaneously enable a low-doped fin with high mobility, excellent device electrostatics and elimination of the substrate junction leakage. Also, the presence of an oxide under the source and drain regions may significantly reduce junction leakage.

One or more embodiments of the present invention provide a "cost-effective" solution to improving transistor performance and reducing stand-by power, e.g., for system-on-chip (SOC) ultra-low power devices which are limited by junction leakage in standby mode. Although such benefits may also be achieved doping very highly the subFIN region, such doping is difficult to perform without affecting the channel doping and, hence, impacting mobility. Alternatively, a prefabricated SOI substrate may be used but typically requires higher fabrication costs. Accordingly, one or more embodiments involve the fabrication of, e.g., FinFETs or trigate devices based on FINS with a buried oxide layer. In one such embodiment, the buried oxide layer isolates the active fin channel from the underlying substrate. Such approaches may be cost-effective solutions since they may begin with bulk substrates and the isolating of the active fin from the substrate may be performed using localized oxidation in the subfin region.

In an aspect, an isolation pedestal is formed between a semiconductor body and a semiconductor substrate. FIG. 1A illustrates a plan view of a semiconductor device 100, in accordance with an embodiment of the present invention. FIG. 1B illustrates a cross-sectional channel view of the semiconductor device 100 of FIG. 1A, as taken along the a-a' axis. FIG. 1C illustrates a cross-sectional source/drain view of the semiconductor device 100 of FIG. 1A, as taken along the b-b' axis.

Referring to FIG. 1A, a semiconductor device 100 includes a semiconductor body 102 disposed above a semiconductor substrate (shown in FIGS. 1B and 1C as 110). The semiconductor body 102 includes a channel region 104 and a pair of source and drain regions 106 on either side of the channel region 104. The semiconductor device 100 also includes a gate electrode stack 108 at least partially surrounding a portion of the channel region 104 of the semiconductor body 102.

Semiconductor device 100 (and any of the semiconductor devices described herein) may be a transistor or like device. For example, in an embodiment, semiconductor device is a metal-oxide semiconductor (MOS) transistor for logic or memory, or is a bipolar transistor. Also, in an embodiment, semiconductor device 100 has a three-dimensional architecture, such as a trigate device, an independently accessed double gate device, or a FIN-FETs.

Semiconductor body 102 may be composed of a material suitable to allow current flow during operation of a semiconductor device there from. For example, in one embodiment, the semiconductor body 102 is composed of a single crystal of a material which may include, but is not limited to, silicon, germanium, silicon-germanium or a III-V compound semiconductor material. Channel region 104 is, in one embodiment, an undoped or lightly doped region of semiconductor body 102. The source and drain regions 106 are, in one embodiment, heavily doped regions of semiconductor body 102. In one embodiment, semiconductor body is composed of a group IV material and one or more portions are doped with boron, arsenic, phosphorus, indium or a combination thereof. In another embodiment, semiconductor body is composed of a group III-V material and one or more portions are doped with carbon, silicon, germanium, oxygen, sulfur, selenium or tellurium. In an embodiment, at least a portion of semiconductor material 102 is strained. In an embodiment, contact is made to source and drain regions 106 with a metal species. The metal species may be a pure metal, such as nickel or cobalt, or may be an alloy such as a metal-metal alloy or a metal-semiconductor alloy (e.g., such as a silicide material).

In an embodiment, the gate electrode of gate electrode stack 108 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the semiconductor body 104. In an embodiment, the gate dielectric layer is comprised of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In an embodiment, the gate electrode stack 108 also includes sidewall spacers which may be composed of an insulative dielectric material.

Referring to FIGS. 1B and 1C, the semiconductor device 100 also includes an isolation pedestal (e.g., the isolation pedestal 112 of FIG. 1B or the isolation pedestal 114 of FIG. 1C) disposed between the semiconductor body 102 (e.g., the channel region 104 of FIG. 1B or the source/drain region 106 of FIG. 1C) and the semiconductor substrate 110. In an embodiment, the semiconductor body 102 (as 104 or 106) has a first width (W1). The isolation pedestal 112 or 114 has a second width (W2) parallel with W1. In an embodiment, W2 is less than W1, as depicted in both FIGS. 1B and 1C. In one embodiment (not shown), the isolation pedestal 112 or 114 has essentially vertical sidewalls with W2 less than W1. In another embodiment, however, the isolation pedestal 112 or 114 is notched with rounded edges beneath the semiconductor body 102, as depicted in FIGS. 1B and 1C.

In an embodiment, the semiconductor device 100 includes only the isolation pedestal 112 disposed below the channel region 104, as depicted in FIG. 1B. In one such embodiment, the pair of source and drain regions is not electrically isolated from the semiconductor substrate 110. In another embodiment, the semiconductor device 100 includes only the isolation pedestal 114 disposed below the pair of source and drain regions 106, as depicted in FIG. 1C. In one such embodiment, the channel region 104 is not electrically isolated from the semiconductor substrate 110. In yet another embodiment, the isolation pedestal (e.g., as a combination of 112 and 114, as depicted in FIGS. 1B and 1C) is disposed below the pair of source and drain regions 106 and below the channel region 104 of the semiconductor body 102. Thus, both the pair of source and drain regions 106 and the channel region 104 may be electrically isolated from the semiconductor substrate 110.

In an embodiment, the term "isolation pedestal" is used to covey a discrete isolation structure formed at a given time, e.g., a discrete structure formed only under a channel region, or a pair of discrete structures formed only under a pair of source and drain regions, or a discrete structure formed under a channel region as well as under a pair of source and drain regions. In another embodiment, the term "isolation pedestal" is used to covey a combination of isolation structures formed at different times, e.g., a discrete structure formed under a channel region in combination with a pair of discrete structures formed, at a different time, under a pair of source and drain regions.

The isolation pedestal 112 or 114 may be composed of a material suitable to electrically isolate at least a portion of the semiconductor body 102 from the semiconductor substrate 110. For example, in one embodiment, the isolation pedestal 112 or 114 is composed of a dielectric material such as, but not limited to, silicon dioxide, silicon oxy-nitride or silicon nitride. In an embodiment, the isolation pedestal 112 or 114 is composed of an oxide of the semiconductor material of the semiconductor body 102. In another embodiment, the isolation pedestal 112 or 114 is composed of an oxide of a semiconductor material different from the semiconductor material of the semiconductor body 102.

Semiconductor substrate 110 may be composed of a material suitable for semiconductor device fabrication. In an embodiment, semiconductor substrate 110 is a bulk substrate. For example, in one embodiment, the semiconductor substrate 110 is a bulk substrate composed of a single crystal of a material which may include, but is not limited to, silicon, germanium, silicon-germanium or a III-V compound semiconductor material. Alternatively, semiconductor substrate 110 includes an upper epitaxial layer and a lower bulk portion, either of which may be composed of a single crystal of a material which may include, but is not limited to, silicon, germanium, silicon-germanium or a III-V compound semiconductor material. An intervening insulator layer composed of a material which may include, but is not limited to, silicon dioxide, silicon nitride or silicon oxy-nitride may be disposed between the upper epitaxial layer and the lower bulk portion.

Referring again to FIGS. 1B and 1C, the semiconductor device 100 further includes, in an embodiment, a first dielectric layer 116 disposed adjacent to the isolation pedestal 112 or 114 and above the semiconductor substrate 110. The first dielectric layer 116 is distinct from the isolation pedestal 112 or 114. For example, even if composed of the same material as the isolation pedestal 112 or 114, the first dielectric layer 116 is contiguous with, but not continuous with, the isolation pedestal 112 or 114. In an embodiment, the first dielectric layer 116 is composed of a material suitable to electrically isolate a portion of the gate electrode stack 108 from the semiconductor substrate 110. For example, in one embodiment, the first dielectric layer 116 is composed of a dielectric material such as, but not limited to, silicon dioxide, silicon oxy-nitride or silicon nitride.

Referring again to FIGS. 1B and 1C, the semiconductor device 100 further includes, in an embodiment, a second dielectric layer 118 disposed below the first dielectric layer 116 and on the semiconductor substrate 110. The second dielectric layer 118 is depicted with dotted lines as it may be an artifact of the process selected to fabricate the semiconductor device 100 (e.g., see FIG. 5A-5D to illustrate an embodiment wherein shallow trench isolation region is recessed for isolation pedestal fabrication. In such a case, the second dielectric layer 118 is composed of remaining shallow trench isolation material. In one embodiment, the second dielectric layer 118 is composed of a dielectric material such as, but not limited to, silicon dioxide, silicon oxy-nitride or silicon nitride.

In an embodiment, semiconductor device 100 further includes one or more nanowires disposed vertically above the semiconductor body 102. In one such embodiment, the gate electrode stack 108 at least partially surrounds a portion of each of the one or more nanowires. Thus, embodiments herein are targeted at both single channel devices and multiple channel devices. In an embodiment, each of the additional nanowires includes a channel region disposed in the nanowire. In one embodiment, the channel region of each nanowire is discrete in that it is completely surrounded by the gate electrode stack 108 without any intervening material such as underlying substrate material or overlying channel fabrication materials. Accordingly, in embodiments having a plurality of nanowires disposed above semiconductor body 102, the channel regions of the nanowires and the semiconductor body are discrete relative to one another.

In an embodiment, the semiconductor body 102 and any additional nanowires may be sized as wires or ribbons, depending on width to height ratio, and may have squared-off or rounder corners. In an embodiment, the dimensions of the semiconductor body 102 and any additional nanowires, from a cross-sectional perspective, are on the nano-scale. For example, in a specific embodiment, the smallest dimension of each of the semiconductor body 102 and any additional nanowires is less than approximately 20 nanometers.

In another aspect, the profile of an isolation pedestal may have faceted notches instead of vertical sidewalls or notches formed from rounded edges. For example, FIG. 1A illustrates a plan view of a semiconductor device 200, in accordance with another embodiment of the present invention. FIG. 2A illustrates a cross-sectional channel view of the semiconductor device 200 of FIG. 1A, as taken along the a-a' axis. FIG. 2B illustrates a cross-sectional source/drain view of the semiconductor device 200 of FIG. 1A, as taken along the b-b' axis.

Referring to FIG. 1A, a semiconductor device 200 includes a semiconductor body 102 disposed above a semiconductor substrate (shown in FIGS. 2A and 2B as 110). The semiconductor body 102 includes a channel region 104 and a pair of source and drain regions 106 on either side of the channel region 104. The semiconductor device 200 also includes a gate electrode stack 108 at least partially surrounding a portion of the channel region 104 of the semiconductor body 102.

Referring to FIGS. 2A and 2B, the semiconductor device 200 also includes an isolation pedestal (e.g., the isolation pedestal 212 of FIG. 2A or the isolation pedestal 214 of FIG. 2B) disposed between the semiconductor body 102 (e.g., the channel region 104 of FIG. 2A or the source/drain region 106 of FIG. 2B) and the semiconductor substrate 110. In an embodiment, the semiconductor body 102 (as 104 or 106) has a first width (W1). The isolation pedestal 212 or 214 has a second width (W2) parallel with W1. In an embodiment, the isolation pedestal 212 or 214 is notched with faceted edges beneath the semiconductor body 102. That is, W2 is less than W1, as depicted in both FIGS. 2A and 2B.

In an embodiment, isolation pedestal 212 or 214 may be positioned under semiconductor body 102, may be composed of a material, and may have a definition according to the positioning, composition, and definition options for isolation pedestals 112 and 114, as described in association with semiconductor device 100 and FIGS. 1B and 1C. In an embodiment, the semiconductor device 200 further includes one or both of a first dielectric layer 116 and a second dielectric layer 118, as shown in FIGS. 2A and 2B and as also described above in association with semiconductor device 100 and FIGS. 1B and 1C. In an embodiment, the semiconductor device 200 further includes one or more nanowires disposed vertically above the semiconductor body 102, as also described above in association with semiconductor device 100.

In another aspect, a pedestal is formed from an oxide of a semiconductor material different than the semiconductor material of an overlying semiconductor body. For example, FIG. 1A illustrates a plan view of a semiconductor device 300, in accordance with another embodiment of the present invention. FIG. 3A illustrates a cross-sectional channel view of the semiconductor device 300 of FIG. 1A, as taken along the a-a' axis. FIG. 3B illustrates a cross-sectional source/drain view of the semiconductor device 300 of FIG. 1A, as taken along the b-b' axis.

Referring to FIG. 1A, a semiconductor device 300 includes a semiconductor body 102 disposed above a semiconductor substrate (shown in FIGS. 3A and 3B as 110). The semiconductor body 102 includes a channel region 104 and a pair of source and drain regions 106 on either side of the channel region 104. The semiconductor device 300 also includes a gate electrode stack 108 at least partially surrounding a portion of the channel region 104 of the semiconductor body 102.

Referring to FIGS. 3A and 3B, the semiconductor device 300 also includes an isolation pedestal (e.g., the isolation pedestal 312 of FIG. 3A or the isolation pedestal 314 of FIG. 3B) disposed between the semiconductor body 102 (e.g., the channel region 104 of FIG. 3A or the source/drain region 106 of FIG. 3B) and the semiconductor substrate 110. In an embodiment, the semiconductor body 102 is composed of a first semiconductor material. The isolation pedestal 312 or 314 is composed of an oxide of a second semiconductor material different from the first semiconductor material. For example, in one such embodiment, the semiconductor body 102 is composed of silicon, and the second semiconductor material is silicon germanium. Alternatively, in another such embodiment, the semiconductor body 102 is composed of silicon germanium and the second semiconductor material is silicon.

In an embodiment, isolation pedestal 312 or 314 may be positioned under semiconductor body 102 and may have a definition according to the positioning and definition options for isolation pedestals 112 and 114, as described in association with semiconductor device 100 and FIGS. 1B and 1C. In an embodiment, the semiconductor device 300 further includes one or both of a first dielectric layer 116 and a second dielectric layer 118, as shown in FIGS. 3A and 3B and as also described above in association with semiconductor device 100 and FIGS. 1B and 1C. In an embodiment, the semiconductor device 300 further includes one or more nanowires disposed vertically above the semiconductor body 102, as also described above in association with semiconductor device 100.

Although depicted as such, the width of the isolation pedestal 312 or 314 need not be the same as the width of the semiconductor body 102. For example, in an embodiment, the semiconductor body 102 (as 104 or 106) has a first width. The isolation pedestal 312 or 314 has a second width parallel with and less than the first width. In one such embodiment, the isolation pedestal 312 or 314 is notched with faceted edges beneath the semiconductor body 102. In another such embodiment, the isolation pedestal 312 or 314 is notched with rounded edges beneath the semiconductor body 102.

In another aspect, methods of fabricating various semiconductor devices are provided. Considerations for various methodologies may include the need to fabricate an "aperture for access" to reveal a region for oxidation underneath a fin. This may be referred to "under fin oxidation" (UFO). In an embodiment, the use of spacers may be required if a same or like material is being oxidized, and may even be included if non-like materials are used. In one embodiment, access to a region under a fin is provided by a replacement gate process or a trench contact process, or both. Embodiments may require that a portion of the fin is "strapped" in place by an overlying feature prior to UFO processing. In an embodiment, an oxidizing atmosphere or an adjacent oxidizing material may be used for UFO. However, in another embodiment illustrated in FIGS. 15A-15D, and oxygen implant is used. In some embodiments, a portion of a material is recessed prior to UFO which may reduce the extent of so-called birds-beak formation during oxidation. In some embodiments, a reflowable oxide is used to fill regions opened during formation of an aperture for access. The above and other considerations may be addressed in the various methods presented below.

Generally, with reference to Figure sets 4-14 below and in accordance with an embodiment of the present invention, a method of fabricating a semiconductor device includes forming a semiconductor body above a semiconductor substrate. The semiconductor body includes a channel region and a pair of source and drain regions on either side of the channel region. An isolation pedestal is formed between the semiconductor body and the semiconductor substrate. Either the semiconductor body has a first width and the isolation pedestal has a second width parallel with and less than the second width, or the semiconductor body is composed of a first semiconductor material and the isolation pedestal is composed of an oxide of a second semiconductor material different from the first semiconductor material, or both. A gate electrode stack is formed at least partially surrounding a portion of the channel region of the semiconductor body.

In an embodiment, the isolation pedestal is formed below the channel region, but not below the pair of source and drain regions, of the semiconductor body. In another embodiment, the isolation pedestal is formed below the pair of source and drain regions, but not below the channel region, of the semiconductor body. In yet another embodiment, the isolation pedestal is formed below the pair of source and drain regions and below the channel region of the semiconductor body. In an embodiment, the method further includes forming a first dielectric layer adjacent to the isolation pedestal and above the semiconductor substrate. In one such embodiment, the method further includes forming a second dielectric layer below the first dielectric layer and on the semiconductor substrate, e.g., prior to formation of the "first" dielectric layer.

Specific examples of various strategies for performing UFO formation of isolation pedestals follow. In a first example, FIGS. 4A-4D and 4D' illustrate cross-sectional views representing various operations in a method of fabricating a semiconductor device, in accordance with an embodiment of the present invention.

Referring to FIG. 4A, a patterning layer 402 is formed above a hardmask stack 404, which in turn is formed above a semiconductor substrate 406. In a specific embodiment, the patterning layer 402 is a silicon nitride spacer mask, the hardmask stack 404 includes approximately 50 nanometers of silicon nitride disposed on a thin silicon dioxide layer, and the semiconductor substrate is a bulk single-crystalline silicon semiconductor substrate. Referring to FIG. 4B, fins are etched into the semiconductor substrate 406 to provide channel regions. In one embodiment, the height of the etched fins are targeted to approximate an HSi value in a device subsequently formed there from. That is, a bulk silicon substrate is patterned into fins using a spacer patterning technique to a depth needed for sub-fin isolation. Referring to FIG. 4C, a spacer liner material is deposited and etched to provide spacers 408. That is, a nitride spacer liner is formed after a partial fin patterning. The nitride spacers along fin sidewalls and the fin nitride hardmask block the subsequent oxidation of the active fin channel region. Referring to FIGS. 4D and 4D', etching of semiconductor substrate 406 is continued, along with undercut formation underneath the spacers 408. Referring to FIG. 4D, in a specific embodiment, an isotropic etch such as an isotropic dry etch is used and the undercut portions 410 have rounded edges. Referring to FIG. 4D', in another specific embodiment, an anisotropic etch such as an anisotropic wet etch is used and the undercut portions 410' have faceted edges. Regions 410 and 410' may then be oxidized to provide isolation pedestals having a geometry such as described in association with FIGS. 1B, 1C, 2A, and 2B. That is, exposed silicon sidewalls are then oxidized to isolate an active fin region from the underlying substrate.

FIGS. 5A-5D illustrate cross-sectional views representing various operations in a second method of fabricating a semiconductor device, in accordance with an embodiment of the present invention. Referring to FIG. 5A, fins 502 are formed from a bulk substrate by recessing a dielectric layer 504, such as a shallow trench isolation oxide layer. A gate placeholder 506, such as a nitride pillar is formed to cover a channel region of the fin (note that in FIG. 5A, the fins extend from the page away from coverage by the gate placeholder 506.) Referring to FIG. 5B, spacers 508 are formed along the sidewalls of the exposed portions of the fins 502. Referring to FIG. 5C, the dielectric layer 504 is further recessed to expose portions 510 of the fins 502. Note that since the portions of the fins 502 underneath the gate placeholder 508 are protected, this process may be used to provide isolation in the source and drain regions of the fins 502. For example, referring to FIG. 5D, the exposed portions 510 are oxidized to provide isolation pedestals 512. Upon oxidation a reflow oxide may be formed to fill the remaining void under spacers 508, or spacers 508 may be removed. In a further embodiment, the method described in association with FIGS. 5A-5D may be performed following a source and drain undercut etch and, subsequently, an isolation pedestal may be fabricated under the channel region. Thus, isolation pedestals may be provided under the source and drain regions only, under the channel region only, or under all regions at the same time.

FIGS. 6A-6D illustrate cross-sectional views representing various operations in a third method of fabricating a semiconductor device, in accordance with an embodiment of the present invention. Referring to FIG. 6A, a fin 602 with a hardmask 604 is formed from a bulk substrate 606. A dielectric layer 608, such as a shallow trench isolation oxide layer, is then formed adjacent the fin 602, as depicted in FIG. 6B. Referring to FIG. 6C, the dielectric layer 608 is recessed to expose a portion 610 of the fin 602. Referring to FIG. 6D, the hardmask 604 is removed and a cap layer 612, such as a silicon nitride cap layer, is formed to surround the exposed portion 610 of the fin 602. An anneal may then be performed wherein the dielectric layer 608 is used as a source of oxygen to oxidize fin 602 except for portion 610, leaving portion 610 as an isolated active region. The cap layer 612 may subsequently be removed and a gate electrode, along with other device features, may be formed.

FIGS. 7A-7C illustrate cross-sectional views representing various operations in a fourth method of fabricating a semiconductor device, in accordance with an embodiment of the present invention. Referring to FIG. 7A, using the structure provided in FIG. 6D, the dielectric layer 608 may be further recessed to expose a portion 702 of the fin 602. The exposed portion 702 may then be oxidized, e.g., in an oxidizing atmosphere, to provide an isolation pedestal 704, as depicted in FIG. 7B. Referring to FIG. 7C, the cap layer 612 may subsequently be removed to leave active region 610 above the isolation pedestal 704. A gate electrode, along with other device features, may then be formed. Thus, in contrast to FIGS. 6A-6D, in the embodiment illustrated in FIGS. 7A-7C, an additional shallow trench isolation region recess is performed prior to a thermal oxidation for better control. The method may be repeated post spacer etch to create an oxide under the source and drains only. Or, alternatively, the method may be performed following an undercut etch to form an oxide under the channel region only or under the channel and under the source and drain regions at the same time.

In another aspect, a buried oxide layer may be formed through faster reoxidation of a silicon germanium layer included in a silicon fin. For example, FIGS. 8A-8C illustrate cross-sectional views representing various operations in a fifth method of fabricating a semiconductor device, in accordance with an embodiment of the present invention. Referring to FIG. 8A, a silicon germanium region 802 is included in a silicon fin 804 formed from a bulk silicon substrate 806, e.g., by patterning a layered substrate. A shallow trench isolation oxide 808 is then formed and recessed to provide an oxidizing material adjacent the silicon germanium region 802, as depicted in FIG. 8B. Referring to FIG. 8C, oxidation of the silicon germanium region 802 by the adjacent shallow trench isolation oxide 808 to form an isolation pedestal 810 is rapid as compared with oxidation of the silicon portions of the fin 804.

Or, as an alternative method to FIGS. 8A-8C, if no channel oxidation is desired, FIGS. 9A-9D illustrate cross-sectional views representing various operations in a sixth method of fabricating a semiconductor device, in accordance with an embodiment of the present invention. Referring to FIG. 9A, a silicon germanium region 902 is included in a silicon fin 904 with a hardmask 905 (e.g., a silicon nitride hardmask) formed from a bulk silicon substrate 906, e.g., by patterning a layered substrate. A shallow trench isolation oxide 908 is then formed and recessed to provide an oxidizing material adjacent the silicon germanium region 902, as depicted in FIG. 9B. Referring to FIG. 9C, a cap layer 912, such as a silicon nitride cap layer is formed to cover the exposed portions of the upper silicon region of fin 904. Referring to FIG. 9D, oxidation of the silicon germanium region 902 by the adjacent shallow trench isolation oxide 908 to form an isolation pedestal 910 is rapid as compared with oxidation of the silicon portions of the fin 904. The cap layer 912 protects the upper silicon region of fin 904 from most, if not all, oxidation. The method may be repeated post spacer etch to create an oxide under the source and drains only. Or, alternatively, the method may be performed following an undercut etch to form an oxide under the channel region only or under the channel and under the source and drain regions at the same time.

In another aspect, an isolation pedestal may be formed during a replacement gate, or gate-last, process. For example, FIGS. 10A-10D illustrate cross-sectional views representing various operations in a seventh method of fabricating a semiconductor device, in accordance with an embodiment of the present invention. Referring to FIG. 10A, a patterning layer 1002 is formed above a hardmask stack 1004, which in turn is formed above a semiconductor substrate 1006 including a different semiconductor layer 1007. In a specific embodiment, the patterning layer 1002 is a silicon nitride spacer mask, the hardmask stack 1004 includes approximately 50 nanometers of silicon nitride disposed on a thin silicon dioxide layer, and the semiconductor substrate 1006 is a bulk single-crystalline silicon semiconductor substrate. The layer 1007 may be a silicon germanium layer. Referring to FIG. 10B, fins are etched into the semiconductor substrate 1006, including into layer 1007, to provide channel regions. Referring to FIG. 10C, at a replacement gate operation, the layer 1007 is exposed and selectively etched to leave voids 1020. It is to be understood that the fins are anchored buy epitaxial source and drain regions at this stage. Then, referring to FIG. 10D, a reflow oxide 1022 is formed in the voids 1020 to provide isolation pedestals for the top portions 1022 of the fins. The process can be performed at replacement gate, as shown, or at dummy gate etch, or at an undercut etch exposing the channel region.

In another aspect, an isolation pedestal may be formed during a spacer process. FIGS. 11A-11C illustrate cross-sectional views representing various operations in an eighth method of fabricating a semiconductor device, in accordance with an embodiment of the present invention. Referring to FIG. 11A, fins 1102 are formed from a bulk substrate 1104 (e.g., silicon) and include a differing material layer 1106 (e.g., silicon germanium). A gate placeholder 1108, such as a nitride pillar or polysilicon layer is formed to cover a channel region of the fin (note that in FIG. 11A, the fins extend from the page away from coverage by the gate placeholder 1108). Spacers 1110 are formed along the exposed sidewalls of the fins 1102 and above a shallow trench isolation region 1112. Referring to FIG. 11B, at spacer etch, the shallow trench isolation region 1112 is recessed and the differing material layer 1106 is removed, e.g., by selective wet etch of a silicon germanium layer from a silicon fin. Note that the shallow trench isolation region 1112 is recessed anisotropically such the placeholder gate 1108 can be used as an anchor. Referring to FIG. 11C, a dielectric material 1114, such as a reflow oxide is formed where layer 1106 once was, and is recessed to again expose the upper portions of the fins 1102. It is to be understood that this approach provides an isolation pillar under the source and drain regions only and not under the channel. Accordingly, source and drain junction leakage suppression may be achieved.

Figure 12B:
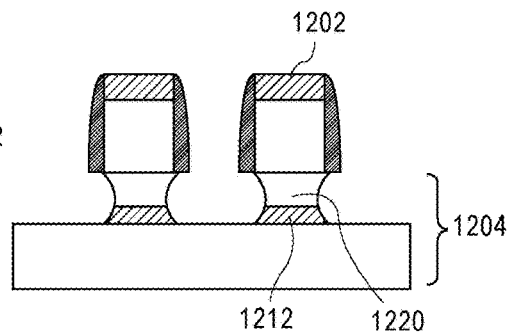
Figure 12C:
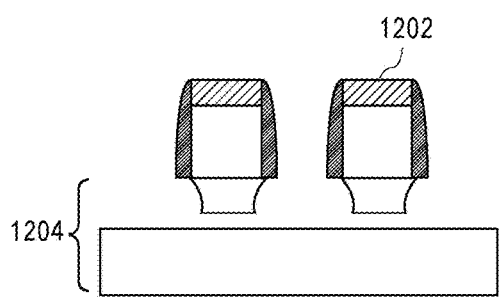
Figure 12D:
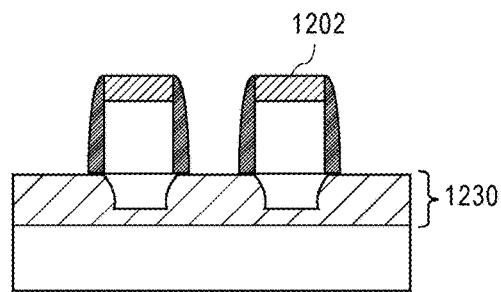

In reference again to FIGS. 11A-11C, another approach may be to oxidize SiGe (or just the Si fin) at the during the shallow trench isolation region recess. That is, isolation may be performed at source and drain undercut. For example, FIGS. 12A-12D illustrate cross-sectional views representing various operations in a ninth method of fabricating a semiconductor device, in accordance with an embodiment of the present invention. Referring to FIG. 12A, gate structures 1202 are depicted as formed on a fin 1204 prior to undercut etch. The fin may include an upper silicon portion 1210, a silicon germanium layer 1212, and a bulk silicon portion 1214. Referring to FIG. 12B, a portion of the fin 1204, including layer 1212, is undercut for eventual source and drain epitaxial layer formation. The undercutting process leaves undercut portions 1220, including remaining portions of the layer 1212. Referring to FIG. 12C, the layer 1212 is entirely removed, with portions of the gate 1202 into and out of the page acting as anchors. Referring to FIG. 12D, a dielectric material 1230, such as a reflow oxide, is deposited and recesses. For epitaxial deposition considerations, e.g., for source and drain epitaxial formation, the dielectric material 1230 may be left to remain only under the channel region.

In another aspect, a fin version of a tuning fork may be fabricated to provide isolation pedestals. For example, FIGS. 13A-13E illustrate cross-sectional views representing various operations in a tenth method of fabricating a semiconductor device, in accordance with an embodiment of the present invention. Referring to FIG. 13A, a silicon substrate 1302 may have disposed thereon a silicon dioxide layer 1304 and a silicon nitride layer 1306. Referring to FIG. 13B, the silicon dioxide layer 1304 and the silicon nitride layer 1306 are etched to expose the silicon substrate 1302. Referring to FIG. 13C, and epitaxial silicon region 1308 is selectively grown on the exposed silicon substrate 1302. Referring to FIG. 13D, a hardmask may be formed and portions of the remaining silicon dioxide layer 1304 and silicon nitride layer 1306 patterned to expose portions of the sides of the fins formed from epitaxial layer 1308. Referring to FIG. 13E, by thermal anneal and oxidation by adjacent oxide layer 1304, an isolation pedestal 1310 is formed in portions of the fin 1308 where an interface remains between the silicon dioxide layer 1304 and the fin 1308, leaving active portions 1312.

In another aspect, under fin oxidation may be performed by using a back bone (BB) support. For example, FIGS. 14A-14H illustrate cross-sectional views representing various operations in an eleventh method of fabricating a semiconductor device, in accordance with an embodiment of the present invention. Referring to FIG. 14A, an epitaxial silicon layer 1402 is formed above an epitaxial silicon germanium layer 1404, which is formed above a bulk silicon substrate 1406. A BB 1408 is formed with spacers 1410 along the sidewalls thereof. Referring to FIG. 14B, a first trench etch is formed to pattern the layers 1402 and 1404. Referring to FIG. 14C, the remaining portion of the epitaxial silicon germanium layer 1404 is recessed under the epitaxial silicon layer 1402. Referring to FIG. 14D, the spacers 1410 are removed, leaving the BB 1408. Referring to FIG. 14E, a dielectric material 1412, such as a reflow oxide layer, is deposited and patterned. Referring to FIG. 14F, the BB 1408 is removed. Referring to FIG. 14G, a second trench etch is performed to remove portions of the epitaxial silicon layer 1402 previously protected by the BB 1408, as well as to remove the remaining portions of the epitaxial silicon germanium layer 1404. Referring to FIG. 14G, the trenches are filled with a dielectric material 1414 to leave active regions 1416 remaining from epitaxial silicon layer 1402 as isolated from substrate 1406.

In another aspect, an oxygen implant is used to isolate a semiconductor body from an underlying semiconductor substrate. For example, in an embodiment, a method of fabricating a semiconductor device includes forming a semiconductor body on a semiconductor substrate. The semiconductor body includes a channel region and a pair of source and drain regions on either side of the channel region. The method also includes implanting oxygen atoms into the semiconductor substrate, on either side of at least a portion of the semiconductor body. The semiconductor substrate is then annealed to form, by oxidation from the implanted oxygen atoms, an isolation pedestal between the portion of the semiconductor body and the semiconductor substrate. A gate electrode stack is formed to at least partially surround a portion of the channel region of the semiconductor body.

In one such embodiment, forming the semiconductor body includes forming a hardmask on the semiconductor body. The method further includes forming a liner layer covering the semiconductor body and the hardmask. The implanting is performed through the liner layer. The method then further includes removing the liner layer and the hardmask subsequent to the implanting.

Figure 15A:
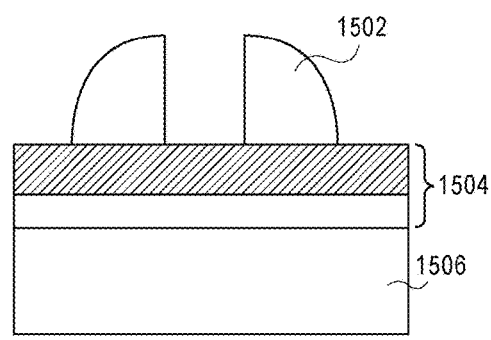
FIGS. 15A-15D illustrate cross-sectional views representing various operations in a twelfth method of fabricating a semiconductor device, in accordance with an embodiment of the present invention.
Figure 15B:
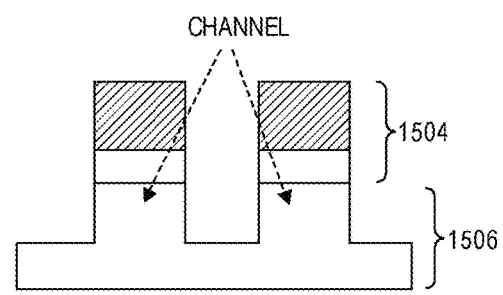
Figure 15C:
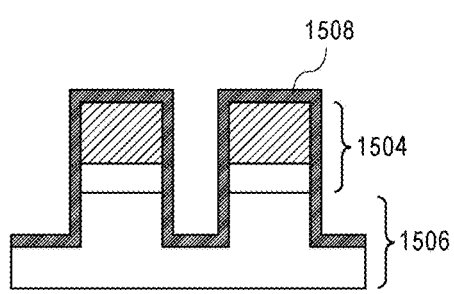
Figure 15D:
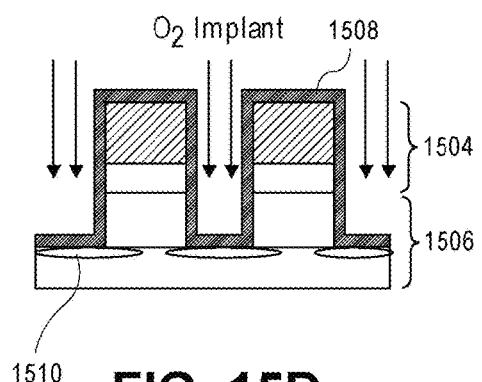

Specifically, FIGS. 15A-15D illustrate cross-sectional views representing various operations in a twelfth method of fabricating a semiconductor device, in accordance with an embodiment of the present invention. Referring to FIG. 15A, a patterning layer 1502 is formed above a hardmask stack 1504, which in turn is formed above a semiconductor substrate 1506. In a specific embodiment, the patterning layer 1502 is a silicon nitride spacer mask, the hardmask stack 1504 includes approximately 50 nanometers of silicon nitride disposed on a thin silicon dioxide layer, and the semiconductor substrate is a bulk single-crystalline silicon semiconductor substrate. Referring to FIG. 15B, fins are etched into the semiconductor substrate 1506 to provide channel regions. In one embodiment, the height of the etched fins are targeted to approximate an HSi value in a device subsequently formed there from. That is, a bulk silicon substrate is patterned into fins using a spacer patterning technique to a depth needed for sub-fin isolation. Referring to FIG. 15C, a liner material 1508 (such as a silicon nitride layer) is deposited conformal with the underlying structure. Referring to FIG. 15D, an oxygen implant is used to provide regions 1510 of substrate 1506 with oxygen atoms incorporated therein. The regions 1510 may be used to form isolating oxide regions upon an anneal process. The method may be repeated post spacer etch to create an oxide under the source and drains only. Or, alternatively, the method may be performed following an undercut etch to form an oxide under the channel region only or under the channel and under the source and drain regions at the same time.

Overall, although previous approaches may involve the use of starting silicon-on insulator (SOI) substrates to fabricate isolated fins, embodiments of the present invention involve the use of starting bulk crystalline substrates, such as silicon substrates. Fin-type semiconductor body structures may then be isolated fin from underlying semiconductor substrate material by using one or more of the localized oxidation processes described herein. In an embodiment, such approaches are compatible with trigate/FinFET processes performed on bulk silicon and may be expected to be more "cost-effective" relative to an SOI approach. In a specific embodiment, semiconductor devices fabricated from one or more processes described herein have increased performance on, e.g., 14 nanometer technology node products. For example, standby leakage may be reduced by including an isolation pedestal.

Figure 16:
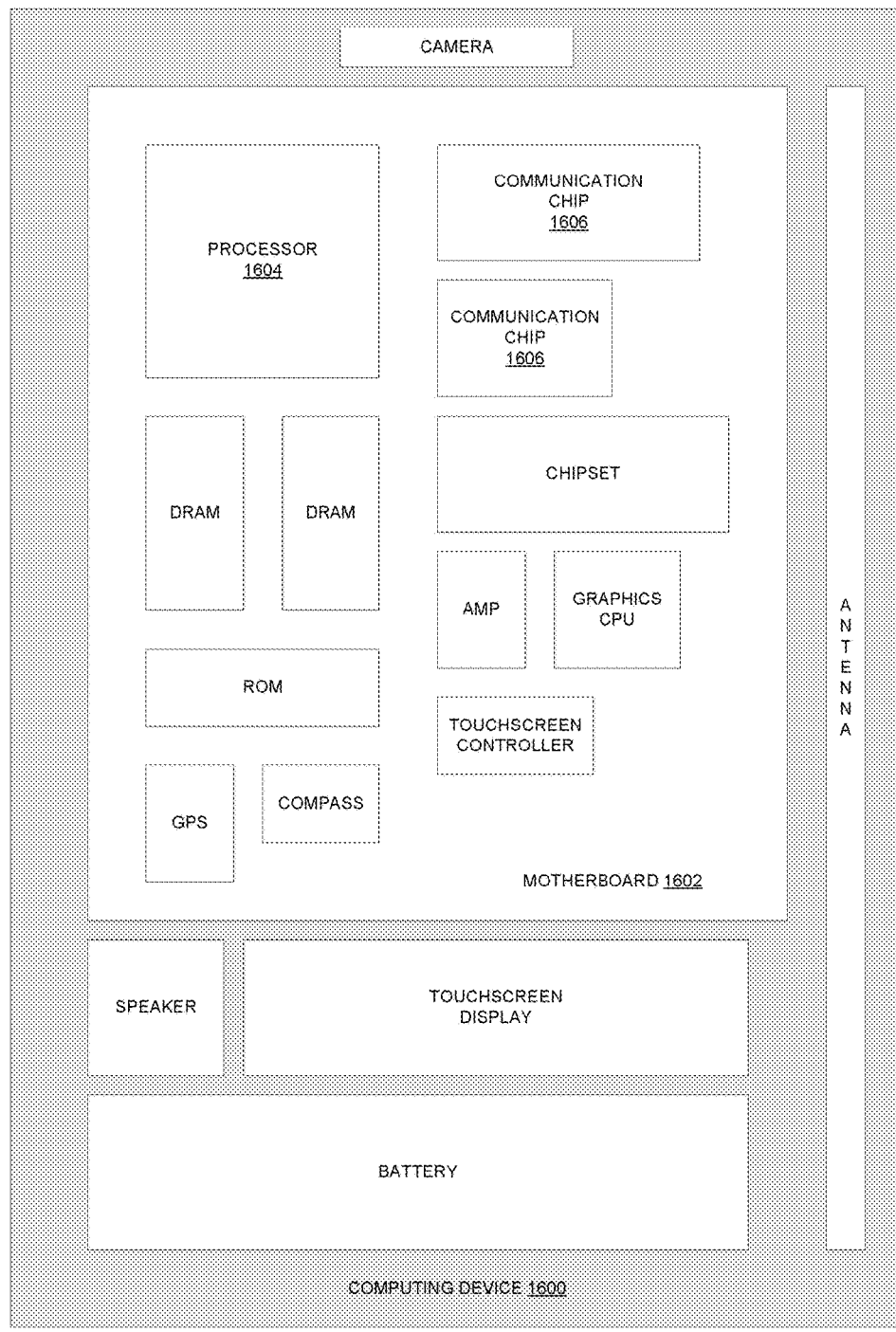
FIG. 16 illustrates a computing device in accordance with one implementation of the invention.

FIG. 16 illustrates a computing device 1600 in accordance with one implementation of the invention. The computing device 1600 houses a board 1602. The board 1602 may include a number of components, including but not limited to a processor 1604 and at least one communication chip 1606. The processor 1604 is physically and electrically coupled to the board 1602. In some implementations the at least one communication chip 1606 is also physically and electrically coupled to the board 1602. In further implementations, the communication chip 1606 is part of the processor 1604.

Depending on its applications, computing device 1600 may include other components that may or may not be physically and electrically coupled to the board 1602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1606 enables wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1600 may include a plurality of communication chips 1606. For instance, a first communication chip 1606 may be dedicated to shorter range wireless communications such as Wi-Fi and Bluetooth and a second communication chip 1606 may be dedicated to longer range wireless communications such as GPS, EDGE, GPRS, CDMA, WiMAX, LTE, Ev-DO, and others.

The processor 1604 of the computing device 1600 includes an integrated circuit die packaged within the processor 1604. In some implementations of the invention, the integrated circuit die of the processor includes one or more devices, such as semiconductor transistors built in accordance with implementations of the invention. The term "processor" may refer to any device or portion of a device that processes electronic data from registers and/or memory to transform that electronic data into other electronic data that may be stored in registers and/or memory.

The communication chip 1606 also includes an integrated circuit die packaged within the communication chip 1606. In accordance with another implementation of the invention, the integrated circuit die of the communication chip includes one or more devices, such as semiconductor transistors built in accordance with implementations of the invention.

In further implementations, another component housed within the computing device 1600 may contain an integrated circuit die that includes one or more devices, such as semiconductor transistors built in accordance with implementations of the invention.

In various implementations, the computing device 1600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1600 may be any other electronic device that processes data.

Thus, semiconductor devices with isolated body portions have been disclosed. In an embodiment, a semiconductor structure includes a semiconductor body disposed above a semiconductor substrate. The semiconductor body includes a channel region and a pair of source and drain regions on either side of the channel region. An isolation pedestal is disposed between the semiconductor body and the semiconductor substrate. A gate electrode stack at least partially surrounds a portion of the channel region of the semiconductor body. In one embodiment, the semiconductor body has a first width, and the isolation pedestal has a second width parallel with and less than the first width. In another embodiment, the semiconductor body is composed of a first semiconductor material, and the isolation pedestal is composed of an oxide of a second semiconductor material different from the first semiconductor material.

What is claimed is:
1. An integrated circuit structure, comprising:
   a semiconductor fin protruding from a semiconductor substrate, the semiconductor fin comprising an upper portion and a lower portion, the upper portion having a channel region;

an insulating region between the upper portion of the semiconductor fin and the lower portion of the semiconductor fin, the insulating region having an approximately vertical seam approximately between a center of the upper portion of the semiconductor fin and a center of the lower portion of the semiconductor fin;

a gate electrode over a top surface of the channel region of the upper portion of the semiconductor fin and adjacent sidewall surfaces of the channel region of the upper portion of the semiconductor fin;

a source region adjacent the channel region at a first side of the gate electrode; and a drain region adjacent the channel region at a second side of the gate electrode opposite the first side of the gate electrode.

2. The integrated circuit structure of claim 1, wherein the approximately vertical seam of the insulating is between a downward protruding point of the upper portion of the semiconductor fin and an upward protruding point of the lower portion of the semiconductor fin.

3. The integrated circuit structure of claim 1, wherein the insulating region comprises an uppermost surface above a top surface of a portion of the insulating region between the upper portion of the semiconductor fin and the lower portion of the semiconductor fin.

4. The integrated circuit structure of claim 1, wherein the lower portion of the semiconductor fin is continuous with the semiconductor substrate.

5. The integrated circuit structure of claim 1, wherein the insulating region electrically isolates the upper portion of the semiconductor fin from the lower portion of the semiconductor fin.

6. The integrated circuit structure of claim 1, wherein the semiconductor fin is a silicon semiconductor fin.

7. The integrated circuit structure of claim 6, wherein the insulating region comprises an oxide of silicon germanium.

8. The integrated circuit structure of claim 1, wherein the gate electrode comprises a metal.

9. The integrated circuit structure of claim 1, further comprising a high-K gate dielectric layer between the gate electrode and the channel region of the upper portion of the semiconductor fin.

10. The integrated circuit structure of claim 1, further comprising:

one or more nanowires vertically above the upper portion of the semiconductor fin, wherein the gate electrode at least partially surrounds a portion of each of the one or more nanowires.

11. A method of fabricating an integrated circuit structure, the method comprising:

forming a semiconductor body above a semiconductor substrate, the semiconductor body comprising a channel region and a pair of source and drain regions on either side of the channel region;

forming an isolation pedestal between the semiconductor body and the semiconductor substrate, wherein the semiconductor body comprises a first semiconductor material and the isolation pedestal comprises an oxide of a second semiconductor material different from the first semiconductor material and an approximately vertical seam centered within the isolation pedestal, the approximately vertical seam continuous between the semiconductor body and the semiconductor substrate; and forming a gate electrode stack at least partially surrounding a portion of the channel region of the semiconductor body.

12. The method of claim 11, wherein the isolation pedestal is formed below the channel region, but not below the pair of source and drain regions, of the semiconductor body.

13. The method of claim 11, wherein the isolation pedestal is formed below the pair of source and drain regions, but not below the channel region, of the semiconductor body.

14. The method of claim 11, wherein the isolation pedestal is formed below the pair of source and drain regions and below the channel region of the semiconductor body.

15. The method of claim 11, further comprising:

forming a first dielectric layer adjacent to the isolation pedestal and above the semiconductor substrate; and forming a second dielectric layer below the first dielectric layer and on the semiconductor substrate.

16. An integrated circuit structure, comprising:

a semiconductor fin protruding from a semiconductor substrate, the semiconductor fin comprising an upper portion and a lower portion, the upper portion having a channel region;

an insulating region between the upper portion of the semiconductor fin and the lower portion of the semiconductor fin, the insulating region between a downward protruding flat surface of the upper portion of the semiconductor fin and an upward protruding flat surface of the lower portion of the semiconductor fin;

a gate electrode over a top surface of the channel region of the upper portion of the semiconductor fin and adjacent sidewall surfaces of the channel region of the upper portion of the semiconductor fin;

a source region adjacent the channel region at a first side of the gate electrode; and a drain region adjacent the channel region at a second side of the gate electrode opposite the first side of the gate electrode.

17. The integrated circuit structure of claim 16, wherein the insulating region comprises a laterally continuous material on between the downward protruding flat surface of the upper portion of the semiconductor fin and the upward protruding flat surface of the lower portion of the semiconductor fin.

18. The integrated circuit structure of claim 16, wherein the insulating region comprises an uppermost surface above a top surface of a portion of the insulating region between the upper portion of the semiconductor fin and the lower portion of the semiconductor fin.

19. The integrated circuit structure of claim 16, wherein the lower portion of the semiconductor fin is continuous with the semiconductor substrate.

20. The integrated circuit structure of claim 16, wherein the insulating region electrically isolates the upper portion of the semiconductor fin from the lower portion of the semiconductor fin.

21. The integrated circuit structure of claim 16, wherein the semiconductor fin is a silicon semiconductor fin.

22. The integrated circuit structure of claim 21, wherein the insulating region comprises an oxide of silicon germanium.

23. The integrated circuit structure of claim 16, wherein the gate electrode comprises a metal.

24. The integrated circuit structure of claim 16, further comprising a high-K gate dielectric layer between the gate electrode and the channel region of the upper portion of the semiconductor fin.

25. The s integrated circuit structure of claim 16, further comprising:

one or more nanowires vertically above the upper portion of the semiconductor fin, wherein the gate electrode at least partially surrounds a portion of each of the one or more nanowires.

* * * * *